(12) United States Patent
Chang et al.

(10) Patent No.: US 10,727,260 B2
(45) Date of Patent: Jul. 28, 2020

(54) IMAGE SENSOR PACKAGING METHOD, IMAGE SENSOR PACKAGE AND LENS MODULE

(71) Applicant: INNO-PACH TECHNOLOGY PTE LTD, Singapore (SG)

(72) Inventors: Liping Chang, Singapore (SG); Deze Yu, Singapore (SG); Wanning Zhang, Singapore (SG)

(73) Assignee: Inno-Pach Technology Pte Ltd., Singapore (SG)

( * ) Notice: Subject to any disclaimer, the term of this patent is extended or adjusted under 35 U.S.C. 154(b) by 189 days.

(21) Appl. No.: 15/904,902

(22) Filed: Feb. 26, 2018

(65) Prior Publication Data

US 2019/0123081 A1 Apr. 25, 2019

(30) Foreign Application Priority Data

Oct. 20, 2017 (CN) .......................... 2017 1 0986559

(51) Int. Cl.
*H01L 27/146* (2006.01)
*H01L 21/56* (2006.01)
*H01L 21/768* (2006.01)

(52) U.S. Cl.
CPC ...... *H01L 27/14618* (2013.01); *H01L 21/561* (2013.01); *H01L 21/565* (2013.01); *H01L 21/568* (2013.01); *H01L 21/76802* (2013.01); *H01L 21/76877* (2013.01); *H01L 27/14627* (2013.01); *H01L 27/14632* (2013.01); *H01L 27/14636* (2013.01); *H01L 27/14698* (2013.01); *H01L 27/14623* (2013.01); *H01L 27/14645* (2013.01); *H01L 27/14685* (2013.01); *H01L 2224/2401* (2013.01); (Continued)

(58) Field of Classification Search
CPC ......... H01L 27/14627; H01L 27/14632; H01L 27/14636; H01L 2224/2401; H01L 2224/24101; H01L 2224/24105; H01L 2224/24155
See application file for complete search history.

(56) References Cited

U.S. PATENT DOCUMENTS

| 9,691,708 B1* | 6/2017 | Huang ................ H01L 23/5389 |
| 2013/0056844 A1* | 3/2013 | Oganesian ........ H01L 27/14634 257/443 |
| 2017/0271248 A1* | 9/2017 | Chen .................. H01L 21/4846 |

(Continued)

*Primary Examiner* — Marcos D. Pizarro
(74) *Attorney, Agent, or Firm* — Muncy, Geissler, Olds & Lowe, P.C.

(57) ABSTRACT

An image sensor packaging method, an image sensor package and a lens module are disclosed. In the image sensor packaging method, plural image sensor dies are formed within a molded layer, resulting in a package with a significantly reduced thickness which is favorable to the slimming of the package. The packaging method does not involve any wire bonding process. Instead, metal pads are led out through a thin metal film formed in non-photosensitive areas on the same side of micro lens surfaces of the image sensor dies. This approach has a less adverse impact on micro lens surfaces and, compared to the wire bonding process, allows a smaller spacing from metal pads to the micro lens surfaces with respect to a direction parallel to the micro lens surfaces, which enables more compact image sensor dies usable in a lens module for an optimized spatial design and ease of miniaturization.

6 Claims, 4 Drawing Sheets

(52) U.S. Cl.
CPC .............. *H01L 2224/24101* (2013.01); *H01L 2224/24105* (2013.01); *H01L 2224/24155* (2013.01)

(56) References Cited

U.S. PATENT DOCUMENTS

2018/0337142 A1* 11/2018 Cheng ................. H01L 23/3107
2019/0074399 A1*  3/2019 Masuda ................ H01L 25/167

* cited by examiner

| Bond a plurality of image sensor dies, each comprising a micro lens surface, a backside opposing the micro lens surface and metal pads arranged in non-micro lens areas on the same side as the micro lens surface, onto the surface of a carrier board so that they are spaced apart from one another with their micro lens surfaces facing toward the same direction | S1 |

↓

| Form a molded layer which covers a portion of the surface of the carrier board between the plurality of image sensor dies and comprises a first surface facing toward the same direction as the micro lens surfaces and a second surface facing toward the same direction as the backsides, wherein the distance between the first and second surfaces is equal to or greater than the distance between the micro lens surfaces and backsides of the image sensor dies | S2 |

↓

| Remove the carrier board and form several via penetrating through the molded layer. each filled with a conductive material | S3 |

↓

| Form a front-side structure on the same side as the micro lens surfaces, which comprises, formed sequentially out of the micro lens surfaces, a first passivation layer, a thin metal film and a second passivation layer | S4 |

↓

| Form a backside structure on the same side as the backsides of the image sensor dies, which comprises a third passivation layer covering both the second surface and the backsides of the image sensor dies and a backside metal layer on the surface of the third passivation layer, wherein both the thin metal film and the backside metal layer are in contact with the vias and wherein the thin metal film is further in contact with the metal pads | S5 |

FIG. 2

IMAGE SENSOR PACKAGING METHOD, IMAGE SENSOR PACKAGE AND LENS MODULE

CROSS-REFERENCES TO RELATED APPLICATIONS

This application claims the priority of Chinese patent application number 201710986559.X, filed on Oct. 20, 2017, the entire contents of which are incorporated herein by reference.

TECHNICAL FIELD

The present invention relates to the field of image sensors and, in particular, to an image sensor packaging method, an image sensor package and a lens module.

BACKGROUND

An image sensor is a semiconductor device capable of sensing external light and converting it into an electrical signal. Current integrated circuit (IC) processes allow hundreds or even thousands of image sensor dies to be formed on the same wafer. These image sensor dies are then packaged into image sensor packages, bonded with terminal leads onto their metal pads and provided with lenses and lens holders to form lens modules which can be used in cameras, smart phones, digital cameras, automotive imaging systems, toys and other electronic devices.

A commonly-used conventional image sensor packaging method is known as chip-on-board (COB) packaging in which image sensor dies are bonded onto an printed circuit board (typically, a PCB) with a conductive or non-conductive adhesive and then wire bonding is carried out for their electrical connections. Subsequently, micro lens of the image sensor dies are provided with micro lenses surfaces, for example, by epoxy resin.

FIG. 1 schematically illustrates a cross section of an image sensor package resulting from a conventional COB packaging process. As shown in FIG. 1, the image sensor package includes, along a direction perpendicular to micro lens surfaces 11 of image sensor dies 10 (i.e., the areas for reception of external light and for photoelectric conversion), a PCB board 15, the image sensor dies 10 (each including a substrate 12, the micro lens surface 11 and the metal pads 13), a protective layer 14 (such as an anti-reflection layer and has a material of $SiO_2$) over the micro lens surfaces 11 and metal leads 17 connecting the metal pads 13 to the PCB board 15. On the one hand, since the image sensor dies 10 reside on the PCB board 15, the sensor package has a relative great thickness (i.e., its longitudinal dimension as viewed in FIG. 1). On the other hand, the metal leads 17 are typically bonded to the metal pads 13 and the PCB board 15 by wire bonding, which usually requires the metal pads 13 to be spaced from the micro lens surfaces 11 by a distance d of 500 μm or larger (with respect to a direction parallel to the micro lens surface 11) due to process constraints. This is unfavorable to further shrinkage of the image sensor package. Moreover, these two disadvantages can both lead to dimensional limitations to the subsequent construction of a lens module from the package of FIG. 1.

SUMMARY OF THE INVENTION

It is an objective of the present invention to solve the problem of a great thickness of the image sensor package resulting from the chip-on-board (COB) packaging process which is unfavorable to the slimming of the image sensor package.

To this end, in one aspect, the present invention provides an image sensor packaging method, including:

bonding a plurality of image sensor dies onto a surface of a carrier board with the plurality of image sensor dies being spaced apart from one another, the plurality of image sensor dies including micro lens surfaces oriented in a same direction and backsides opposing to the micro lens surfaces;

forming a molded layer which covers portions of the surface of the carrier board between the plurality of image sensor dies and includes a first surface oriented in a same direction as the micro lens surfaces and a second surface oriented in a same direction as the backsides; and removing the carrier board, wherein a distance between the first and second surfaces of the molded layer is equal to or greater than a distance between the micro lens surfaces and the backsides of the plurality of image sensor dies.

Optionally, the molded layer may include a thermosetting resin.

Optionally, the image sensor dies may further include metal pads formed in non-photosensitive areas on a side of the micro lens surfaces, the metal pads adapted to connect the plurality of image sensor dies to an external circuitry.

Optionally, the packaging method may further include: forming vias penetrating through the molded layer and filled with a conductive material; forming a front-side structure on the side of the micro lens surfaces, the front-side structure including, formed sequentially external to the micro lens surfaces, a first passivation layer, a thin metal film and a second passivation layer, and forming a backside structure on a side of the backsides of the plurality of image sensor dies, the backside structure including a third passivation layer covering both the second surface and the backsides of the plurality of image sensor dies and a backside metal layer on a surface of the third passivation layer, wherein both the thin metal film and the backside metal layer are in contact with the vias and wherein the thin metal film is further in contact with the metal pads.

Optionally, the packaging method may further include: forming first contact holes and second contact holes in the first passivation layer and forming third contact holes in the third passivation layer, wherein the thin metal film forms contact with the vias and the metal pads through the first contact holes and the second contact holes, respectively; and wherein the backside metal layer forms contact with the vias through the third contact holes.

In another aspect, the present invention also provides an image sensor package, including:

a plurality of image sensor dies spaced apart from one another and including micro lens surfaces oriented in a same direction and backsides opposing to the micro lens surfaces; and a molded layer, which fills gaps between the plurality of image sensor dies and surrounds the plurality of image sensor dies, the molded layer including a first surface oriented in a same direction as the micro lens surfaces and a second surface oriented in a same direction as the backsides, wherein a distance between the first and second surface of the molded layer is equal to or greater than a distance between the micro lens surfaces and the backsides of the plurality of image sensor dies.

Optionally, the package may further include:

metal pads formed in non-micro lens areas on a side of the micro lens surfaces, the metal pads adapted to connect the plurality of image sensor dies to an external circuitry;

vias formed in the molded layer, the vias filled with a conductive material;

a front-side structure on the side of the micro lens surfaces, the front-side structure including, formed sequentially external to the micro lens surfaces, a first passivation layer, a thin metal film and a second passivation layer, a backside structure on a side of the backsides of the plurality of image sensor dies, the backside structure including a third passivation layer covering both the second surface and the backsides of the plurality of image sensor dies and a backside metal layer on a surface of the third passivation layer, wherein both the thin metal film and the backside metal layer are in contact with the vias and wherein the thin metal film is further in contact with the metal pads.

Optionally, the image sensor package may further include: first contact holes and second contact holes formed in the first passivation layer and third contact holes formed in the third passivation layer, wherein the thin metal film forms in contact with the vias and the metal pads through the first contact holes and the second contact holes, respectively; and wherein the backside metal layer forms in contact with the vias through the third contact holes.

Optionally, the image sensor package may further include a protective glass cover which covers the second passivation layer and the micro lens surfaces.

Optionally, the metal pads may be spaced apart from the micro lens surfaces with respect to a direction parallel to the micro lens surfaces by a distance that is smaller than 50 μm.

Optionally, the molded layer may include a thermosetting resin.

In a further aspect, the present invention also provides a lens module including the image sensor package as defined above.

In the image sensor packaging method according to the present invention, the plurality of image sensor dies are bonded to the surface of the carrier board so that they are spaced apart from one another, and a molded layer is formed between the plurality of image sensor dies, followed by the removal of the carrier board, wherein the thickness of the molded layer is equal to or greater than that of the image sensor dies (the thicknesses of them both refer to their dimensions in the direction perpendicular to the micro lens surfaces). That is, the image sensor dies are embedded in the molded layer. Compared to the conventional COB packaging process, this method allows a smaller thickness of the resulting image sensor package by dispensing with the need for an interconnecting board, which is favorable to the slimming of the package. As a result, the thinner image sensor package according to the present invention allows easier miniaturization when used for forming a lens module.

Further, in the image sensor packaging method according to the present invention, the metal pads are formed in the non-photosensitive areas on the same side as the micro lens surfaces of the image sensor dies and led out by a thin metal film formed by a semiconductor thin film process, instead of forming metal leads by a wire bonding process. As a result, the distance from the metal pads to the micro lens surfaces with respect to a direction parallel to the micro lens surfaces can be reduced to smaller than 50 μm, i.e., a further reduction in the size of the image sensor dies which is favorable to a higher integration.

BRIEF DESCRIPTION OF DRAWINGS

FIG. 2 is a flowchart graphically illustrating an image sensor packaging method according to an embodiment of the present invention.

In these figures:

Figure 1:
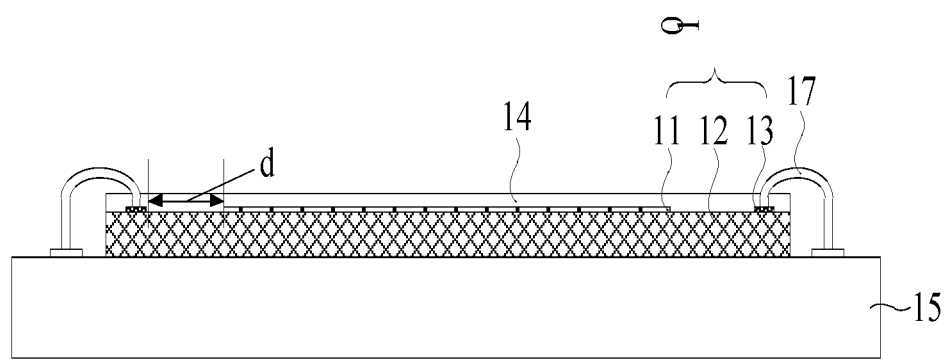
FIG. 1 is a schematic cross-sectional view of an image sensor package resulting from a conventional COB packaging process.

10 and 100—image sensor die; 12—substrate; 15—PCB board; 14—protective layer; 17—metal lead; 200—carrier board; 11, 100a—photosensitive surface; 100c—non-photosensitive area; 100b—backside; 13, 101—metal pad; 150—molded layer; 160—via; 150a—first surface; 150b—second surface; 110—first passivation layer; 120—thin metal film; 130—second passivation layer; 111—first contact hole; 112—second contact hole; 171—third contact hole; 300—front-side structure; 400—backside structure; 170—third passivation layer; 180—backside metal layer; and 181—protective metal film.

DETAILED DESCRIPTION OF EXEMPLARY EMBODIMENTS

The image sensor packaging method, image sensor package and lens module proposed in the present invention will be described in greater detail below with reference to specific embodiments which are to be read in conjunction with the accompanying drawings. Features and advantages of the invention will be more readily apparent from the following detailed description and from the figures. However, it is noted that the concept of the present invention can be implemented in various forms and not limited to the specific embodiments disclosed herein. Additionally, the figures are provided in a very simplified form not necessarily presented to scale, with the only intention to facilitate convenience and clarity in explaining the embodiments.

As used in the specification and claims, the terms "first", "second" and the like are intended to distinguish similar elements and do not necessarily describe a particular order or time sequence. It is to be appreciated that such terms are used interchangeably herein as appropriate such that, for example, the embodiments of the present invention described herein can be implemented in other orders than that described herein. Likewise, if any method described herein includes a sequence of steps, then the order in which these steps are performed as described herein is unnecessarily the only order in which the steps can be carried out. In addition, some of the steps can be omitted, and/or some other steps not described herein can be added to the method. If a certain one of the accompanying drawings contains any element that is identical to that in another one or other ones of the drawings, then for the sake of clarity, the reference numeral for the element may not be marked in all of these figures even if it can be readily identified therein.

Herein, an image sensor packaging method refers primarily to a method for packaging image sensor dies into an image sensor package.

FIG. 2 is a flowchart graphically illustrating an image sensor packaging method according to an embodiment of the present invention which includes the steps as detailed below.

In step S1, a plurality of image sensor dies are bonded onto the surface of a carrier board so that they are spaced apart from one another. Each of the image sensor dies has a micro lens surface and a backside opposing to the micro lens surface. Each image sensor die further has metal pads formed in non-photosensitive areas defined on the same side as the micro lens surface. Additionally, the image sensor dies are so bonded that their micro lens surfaces face toward the same direction.

In step S2, a molded layer is formed, which covers a portion of the surface of the carrier board between the image sensor dies and has a first surface facing toward the same direction as the micro lens surface and a second surface facing toward the same direction as the backside. The distance between the first and second surfaces of the molded layer is equal to or greater than the distance between the micro lens surfaces and backsides of the image sensor dies.

In step S3, the carrier board is removed, followed by the formation of several vias filled with a conductive material in the molded layer.

In step S4, a front-side structure is formed on the same side as the micro lens surfaces, which includes, external to the micro lens surfaces, a first passivation layer, a thin metal film and a second passivation layer.

In step S5, a backside structure is formed on the same side as the backsides of the image sensor dies, which includes a third passivation layer over both the second surface and the backsides and a backside metal layer over the third passivation layer. Both of the thin metal film and the backside metal layer are in contact with the vias, and the thin metal film is further in contact with the metal pads.

FIGS. 3a to 3e are schematic cross-sectional views showing steps in an image sensor packaging method according to an embodiment of the present invention. The image sensor packaging method will be described in further detail below with reference to FIGS. 2 and 3a to 3e.

Figure 3A:
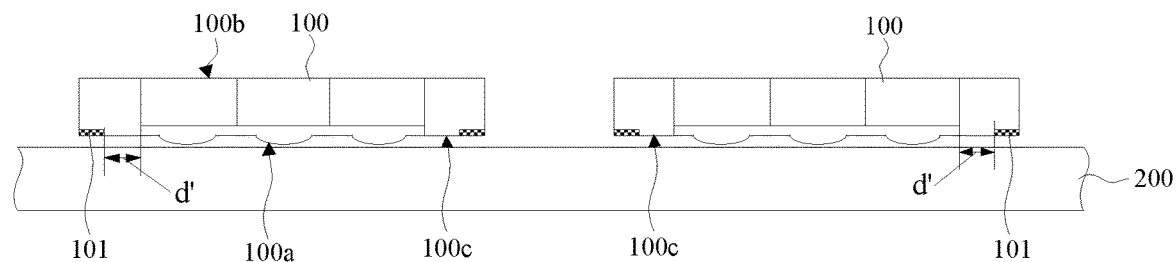
FIGS. 3a to 3e are schematic cross-sectional views showing steps in an image sensor packaging method according to an embodiment of the present invention.

Referring to FIGS. 2 and 3a, in step S1, a plurality of image sensor dies 100 are bonded onto a surface of a carrier board 200 so that they are spaced apart from one another. Each of the image sensor dies 100 has a micro lens surface 100a and a backside 100b opposing to the micro lens surface 100a. Each image sensor die 100 further has metal pads 101 formed in non-photosensitive areas 100c defined on the same side as the micro lens surface 100a. Additionally, the plurality of image sensor dies 100 are so bonded that their micro lens surfaces 100a face toward the same direction.

It is to be noted that while only two image sensor dies 100 are shown in FIG. 3a, more than two identical image sensor dies 100 may also be bonded to the surface of the carrier board 200 in accordance with this embodiment. In another embodiment, in addition to these image sensor dies 100, other functional dies or devices such as image processing dies, central processing dies, passive devices may also be bonded to the surface of the carrier board 200 with intervals spaced apart from one another. Variants may be made by those skilled in the art in the quantity and arrangement of the image sensor dies 100 without departing from the spirit of the present invention.

Specifically, the carrier board 200 may be an auxiliary (or temporary) board made of, for example, glass, ceramic or plastic, and its surface to which the image sensor dies 100 are bonded may be flat and square or round.

In another embodiment, the carrier board 200 may also include a wall extending along its edge, which has a height that is equal to or greater than the thickness of the identical image sensor dies 100 (i.e., the distance between the micro lens surfaces 100a and the backsides 100b). In addition, the wall may be detachable.

The image sensor dies 100 may be bonded to the surface of the carrier board 200 by means of an adhesive (not shown).

The image sensor dies 100 may be implemented as, for example, CMOS or CCD image sensor dies. This embodiment is described with CMOS image sensor dies as an example, each having a micro lens surface 100a, i.e., a micro lens area of the specific image sensor die 100, and a backside 100b, i.e., the surface thereof facing away from the micro lens surface 100a. On the micro lens surface 100a, there may be disposed a micro lens unit for facilitating the incident efficiency of light (primarily visible light). The image sensor die 100 may incorporate red (R), green (G) and blue (B) micro lens elements. Light incident on the micro lens elements may be converted into electric signals (by means of photoelectric conversion) which are transmitted to external circuitry through internal circuitry (not shown). In this embodiment, the micro lens surface 100a is capable of sensing, i.e., performing R, G and B photoelectric conversion on, the light incident on the micro lens unit. On the same side as the micro lens surface 100a, there are also provided non-photosensitive areas 100c, in which two metal pads 101 are arranged for connection to external circuitry, i.e., lead-out areas for internal circuitry of the image sensor die 100. In the direction parallel to the micro lens surface 100a, the metal pads 101 are each spaced from the micro lens surface 100a by a distance d'. In other embodiments, there may also be only one metal pad 101 included, or the metal pads 101 may also be arranged on the same side as the backside 100b of the image sensor die.

While it has been described in this embodiment that, the micro lens surface 100a is bonded to the carrier board 200 using an adhesive with the backside 100b facing away from the carrier board 200, the present invention is not limited thereto, because in other embodiments, it is also possible that the backside 100b is bonded to the carrier board 200 with an adhesive, depending on the configuration of the image sensor die 100.

In this embodiment, the plurality of image sensor dies 100 are so bonded to the surface of the carrier board 200 that they are not in contact with one another. That is, any two of them are spaced apart from each other by an interval so that they are distributed on the surface of the carrier board 200 in an array. The interval(s) between the image sensor dies 100 may be determined according to the requirements of the bonding and fabrication processes, and the present invention is not limited thereto.

Figure 3B:
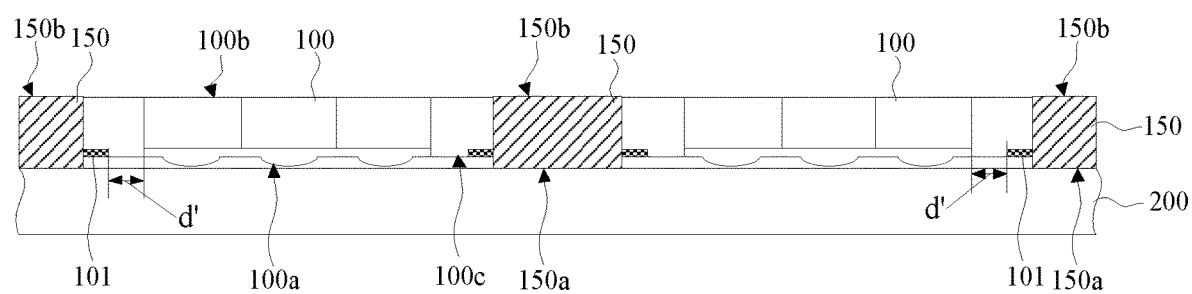

Referring to FIGS. 2 and 3b, in step S2, a molded layer 150 is formed, which covers the surface of the carrier board 200 between the image sensor dies 100 and has a first surface 150a facing toward the same direction as the micro lens surface 100a and a second surface 150b facing toward the same direction as the backside 100b. The distance between the first surface 150a and the second surface 150b of the molded layer 150 is equal to or greater than the distance between the micro lens surface 100a and the backside 100b of each the image sensor die 100.

The molded layer 150 may include a material capable of absorbing at least part of the light, a light-reflective material or a light-scattering material. It may also include an insulating material that is translucent or opaque to visible light (e.g., with a wavelength ranging from 380 nm to 750 nm). It may also include an insulating material with a transmissivity for infrared radiation (e.g., with a wavelength in the range from 750 nm to 1 mm) that is nearly zero. For example, the molded layer 150 may include, but not limited to, a thermoplastic resin such as polycarbonate (PC), polyethylene terephthalate (PET), polyethersulfone, polyphenylether, polyamide, polyetherimide, a methacrylic acid resin or a cyclic polyolefin-based resin, or a thermosetting resin such as an epoxy resin, a phenol resin, a polyurethane resin, an acrylic resin, a vinyl ester resin, an imide-based resin, a polyurethane-based resin, a urea resin or a melamine resin, or an organic insulating material such as polystyrene (PS) or polyacrylonitrile.

In another embodiment, the molded layer 150 may include, but not limited to, an inorganic insulating material such as silicon oxide, silicon nitride, silicon oxynitride, aluminum oxide, titanium oxide, tantalum oxide, zinc oxide or another inorganic oxide or nitride.

In a further embodiment, the molded layer 150 may include an opaque material such as a black matrix material. The black matrix material may include an organic resin, a resin containing a glass paste or a black pigment, or a paste.

In this embodiment, the molded layer 150 preferably includes a thermosetting resin such as an epoxy resin. The addition of the thermosetting resin can enhance the ability of the molded layer 150 and hence of the plurality of image sensor dies 100 to maintain flatness when heated. For example, at a test temperature of up to 260° C., the flatness of the plurality of image sensor dies 100 varies by smaller than 20 µm, in contrast to the conventional COB packaging technology in which the flatness of the plurality of image sensor dies 100 varies by 70 to 90 µm at the same temperature.

Specifically, the epoxy resin may be applied on the surface of the carrier board 200 by a spin-on process. As the image sensor dies 100 are bonded on the surface of the carrier board 200, the material of the molded layer 150 is first filled in the gaps between the image sensor dies 100 on the surface of the carrier board 200, and the used amount of the epoxy resin may be so controlled that the gaps are fully filled with the material. Subsequently, the upper surface of the epoxy resin layer may be made substantially flush with those of the image sensor dies 100, for example, with a scraper, so that its thickness is within a tolerable range. The molded layer 150 may also be so formed that its upper surface is higher than the backsides 100b of the image sensor dies 100. The present invention is, however, not limited thereto. The distance between the first surface 150a and second surface 150b of the molded layer 150 may be equal to or greater than the distance between the micro lens surface 100a and backside 100b of each image sensor die 100. After that, the epoxy resin may be baked and cured. In addition, for example, a dry etching process may be carried out on the molded layer 150 to expose the backsides 100b of the image sensor dies 100 so that the image sensor dies 100 are laterally surrounded by the molded layer 150. In another embodiment, the molded layer 150 may also be formed between the image sensor dies 100 using an ink jet printing (IJP) process. However, the present invention is not limited thereto. The molded layer 150 may be formed by any suitable process selected according to the properties of the material.

Figure 3C:
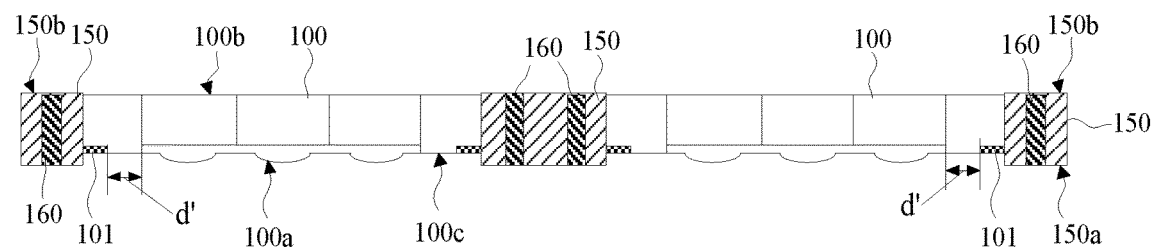

Referring to FIGS. 2 and 3c, in step S3, the carrier board 200 is removed, followed by the formation of several vias 160 filled with a conductive material penetrating through the molded layer 150.

In this embodiment, since the image sensor dies 100 are boned to the carrier board 200 with the adhesive which is, for example, a hot melt adhesive, the carrier board 200 may be removed by heating the carrier board 200 and thus changing the viscosity of the hot melt adhesive. It is noted that, in order to avoid an adverse impact on the molded layer 150, the hot melt adhesive should be heated to a temperature that is lower than the curing temperature of the molded layer 150. In another embodiment, the adhesive has variable viscosity and can be located by means of laser, infrared radiation, ultrasonic waves or the like. In this case, the viscosity of the adhesive can be lowered by heating the carrier board 200, thereby allowing removal of the carrier board 200. In still another embodiment, the carrier board 200 may also be removed by exerting a force between the carrier board 200 and the micro lens surfaces 100a of the image sensor dies 100 to drive them in opposite directions. However, the present invention is not limited thereto. The carrier board 200 may also be removed by, for example, laser peeling or mechanical cutting.

After the carrier board 200 is removed, several through holes may be formed in the molded layer 150 by mechanical drilling, laser perforation, dry etching or another similar technique. In particular, the through holes may be formed using a suitable perforation method selected according to the properties of the material of the molded layer 150. In this embodiment, a laser perforation process can be employed to form the through holes in the molded layer 150 made of the epoxy resin. The through holes may be formed around the image sensor dies 100. That is, one or more of the through holes may be formed in the molded layer 150 near each image sensor die 100.

Afterward, the conductive material may be filled in the through holes to form the vias 160 each capable of connecting an electric connection formed on one surface of the molded layer 150 to another electric connection on the other surface of the molded layer 150. This interconnection technique addresses the limitations of two-dimensional wiring employed in conventional semiconductor dies and can integrate different process materials and different functional modules, resulting in higher integration of the packaged dies which significantly facilitates the optimization of their overall performance.

In this embodiment, copper (Cu) may be filled in the through holes, for example, by electroplating or chemical plating, to form the vias 160. However, the present invention is not limited thereto. The conductive material may be a conductive metal such as tungsten (W), silver (Ag) or gold (Au), a conductive alloy or a conductive adhesive, and the vias 160 may be formed using any suitable approach known in this art.

Figure 3D:
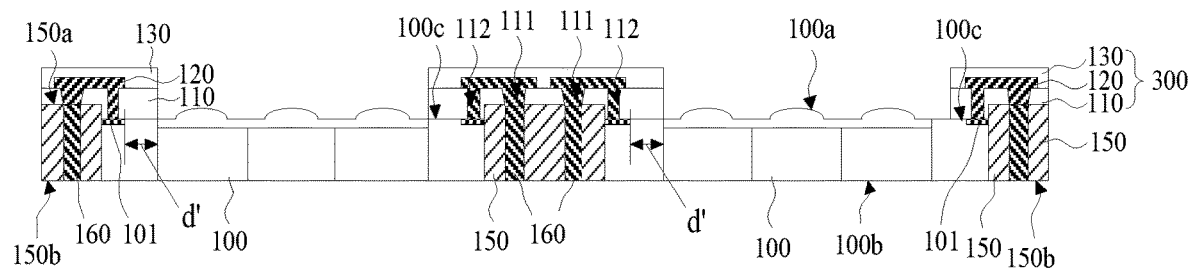

Referring to FIGS. 2 and 3d, in step S4, a front-side structure 300 is formed on the same side of the micro lens surfaces 100a, which includes a first passivation layer 110, a thin metal film 120 and a second passivation layer 130 formed on an area external to the micro lens surfaces 100a.

The front structure 300 is adapted to lead out the metal pads 101 of the image sensor dies 100 and form electric interconnects for connection to external circuitry, thereby allowing the control of all or part of the image sensor dies 100.

Specifically, with reference to FIG. 3d (in which the image sensor dies 100 are shown to be inverted with respect to their configuration of FIG. 3c so that the micro lens surfaces 100a face upward), the first passivation layer 110 of a thickness of about 5-25 µm is formed on an area on the same side as but external to the micro lens surfaces 100a (in this embodiment, it includes the first surface 150a of the molded layer 150 and the non-photosensitive areas 100c). Subsequently, first contact holes 111 may be formed in the first passivation layer 110 above the vias 160, and second contact holes 112 may be formed in the first passivation layer 110 above the metal pads 101 of the image sensor dies 100. A conductive material is then filled in the first contact holes 111 and the second contact holes 112, and a patterned thin metal film is formed on the surface of the first passivation layer 110, i.e., the thin metal film 120 connecting the image sensor dies 100 and the vias 160. The thin metal film 120 is in contact with the vias 160 through the first contact holes 111 and the thin metal film 120 is in contact the metal pads 101 of the image sensor dies 100 through the second contact holes 112. The second passivation layer 130 of a thickness of, for example, about 5-25 µm, is then formed, which covers the first passivation layer 110 and the metal leads 120 but not the micro lens surfaces 100a.

The first and second passivation layers 110, 130 can protect the thin metal film 120 from short circuits, so the first and second passivation layers 110, 130 are preferably both insulating layers formed of the same material or different materials. In this embodiment, they are polymeric material(s) such as, for example, polyimide, benzocyclobutene (BCB) or poly-p-phenylenebenzobisoxazole (PBO) or a combination thereof. They can be formed by a process such as spin coating, thermal curing, exposure, development, gas ashing or demolding. However, the present invention is not limited thereto. The first and second passivation layers 110, 130 may be formed and patterned by a suitable process selected according to the properties of their material(s).

The first and second contact holes 111, 112 may be formed by, for example, a semiconductor dry etching process. With the formation of the first and second contact holes 111, 112 being completed, a plasma vapor deposition (PVD) or thermal evaporation process may be conducted to deposit a metal seed layer extending inside and outside the first and second contact holes 111, 112, followed by coating of a metal layer of a desired thickness on the metal seed layer by electroplating. Thereafter, photoresist application, exposure, development, etching and photoresist removal processes are performed to pattern the metal layer into the thin metal film 120. Specifically, in this embodiment, the thin metal film 120 includes the conductive material filled in the first and second contact holes 111, 112 and the material of the patterned metal layer over the surface of the first passivation layer 110.

Specifically, the thin metal film 120 may be, but not limited to, a metal such as Cu, Ag, W or Au, or a conductive alloy, or a conductive oxide (e.g., ITO). The thin metal film 120 may alternatively be a conductive organic material such as a conductive polymer. In some embodiments, the thin metal film 120 may also be formed by, for example, printing. A thickness of the thin metal film 120 above the surfaces of the first passivation layer 110 is about 3-10 µm, preferably 3-5 µm.

The thin metal film 120 formed by this semiconductor thin film process can connect the image sensor dies 10 to external circuitry, and the process itself has a less adverse impact on the micro lens surfaces 100a when compared to wire bonding for PCB packaging. As a result of forming the thin metal film 120 in the way as described above in this embodiment, a smaller distance d' can be obtained between the metal pads 101 and the micro lens surface 100a with respect to a direction parallel to the micro lens surface 100a for each image sensor die. In this embodiment, the value of d' may be as small as 50 µm or less. In contrast, as described in the Background section, the distance d between the metal pads and the micro lens surface is generally larger than 500 µm in the conventional PCB packaging process. The smaller d' is favorable to the integration of the image sensor dies 100 and hence the miniaturization of the package resulting from the integration of the plurality of image sensor dies 100.

Figure 3E:
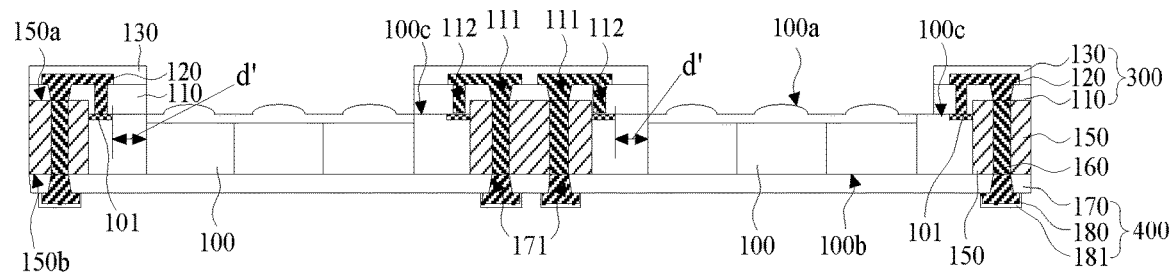

Referring to FIGS. 2 and 3e, in step S5, a backside structure 400 is formed on the same side as the backsides 100b of the image sensor dies 100, which includes a third passivation layer 170 over both the second surface 150b and the backsides 100b and a backside metal layer 180 over the third passivation layer 170. Both of the thin metal film 130 and the backside metal layer 180 are in contact with the vias 160.

In this embodiment, the third passivation layer 170 may be formed of the same material, and by the same semiconductor thin film process, either as the first passivation layer 110 or the second passivation layers 130. The third passivation layer 170 may have a thickness of about 5-50 µm.

After the formation of the third passivation layer 170 has been completed, the third contact holes 171 may be formed in the third passivation layer 170 under the vias 160, followed by filling therein of the same conductive material as, or a different conductive material from, that filled in the vias 160. Subsequently, the backside metal layer 180 is formed that covers the third contact holes 171 and part of the third passivation layer 170. The formation of the backside metal layer 180 may be accomplished either by the same process as the formation of the thin metal film 20 or by another known semiconductor film formation process. In this embodiment, Cu is filled in the third contact holes 171 by a PVD process, and a Cu film is then grown on the surface of the third passivation layer 170 by a plating process, followed by the formation of the backside metal layer 180 by an etching process. Specifically, herein, the backside metal layer 180 includes the conductive material filled in the third contact holes 171 and the material of the patterned conductive layer grown on the surface of the third passivation layer 170. As a result, the backside metal layer 180 comes into contact with the vias 160 through the third contact holes 171.

In a preferred embodiment, on the surface of the backside metal layer 180, there may also be formed a protective metal film 181 implemented as, for example, a nickel-gold (NiAu) film or a tin (Sn) film The NiAu film may be formed by a plating process, while the Sn film may be formed by a tin metaling process.

The image sensor package resulting from steps S1-S5 is as shown in FIG. 3e. Herein, the plurality of image sensor dies 100 are formed within the molded layer 150 and are electrically connected to external circuitry through the frontside structure 300 and the backside structure 400. Subsequently, a lens module may be constructed by mounting a suitable lens unit (e.g., consisting of a group of optical lenses) on the same side as the micro lens surfaces 100a and a lens holder.

With the image sensor packaging method according to this embodiment, on the one hand, the molded layer 150, the third passivation layer 170 and the backside metal layer 180 together serve as a base, and the plurality of image sensor dies 100 are disposed within the molded layer 150. As such, a significantly reduced thickness of the resulting package (i.e., its dimension along the direction perpendicular to the micro lens surfaces 100a), which is favorable to the slimming of the package. On the other hand, the packaging method dispenses with the need for a wire bonding process and allows the metal pads 101 to be led out through the thin metal film 120 formed in the area on the same side as but external to the micro lens surfaces 100a. As the formation imposes a less adverse impact on the micro lens surfaces 100a, a smaller distance d' between the metal pads 101 and the micro lens surfaces 100a with respect to a direction parallel to the micro lens surfaces 100a when compared to a wire bonding process. Specifically, the value of d' may be reduced to less than 50 μm, enabling further shrinkage of the image sensor dies 100, which is conducive to a higher integration of the package. When used in the construction of a lens module, the resulting package can result in an optimized spatial design thereof, for example, ease of miniaturization.

In this embodiment, there is also provided an image sensor package, which as shown in FIG. 3e includes:

a plurality of image sensor dies 100, each including a micro lens surface 100a, a backside 100b opposing to the micro lens surface 100a and metal pads 101 arranged in non-photosensitive areas on the same side as the micro lens surface, which are so arranged that they are spaced apart from one another with their micro lens surfaces 100a facing toward the same direction; and a molded layer 150, which fills gaps between the image sensor dies 100 so that they surround the image sensor dies 100, the molded layer 150 including a first surface 150a facing toward the same direction as the micro lens surfaces 100a and a second surface 150b facing toward the same direction as the backsides 100b, wherein the distance between the first and second surface 150a, 150b is equal to or greater than the distance between the micro lens surfaces 100a and backsides 100b of the image sensor dies 100;

vias 160 filled with a conductive material and formed within the molded layer 150;

a front-side structure 300 on the same side as the micro lens surfaces 100a, the front-side structure 300 includes, sequentially formed external to the micro lens surfaces 100a, a first passivation layer 110, a thin metal film 120 and a second passivation layer 130; and a backside structure 400 on the same side as backsides 100b of the image sensor dies 100, the backside structure 400 includes a third passivation layer 170 covering both the second surface 150b of the molded layer 150 and the backsides 100b of the image sensor dies 100 and a backside metal layer 180 over the surface of the third passivation layer 170, wherein both the thin metal film 120 and the backside metal layer 170 are in contact with the vias 160, and wherein the thin metal film 120 is further in contact with the metal pads 101.

Specifically, in the first passivation layer 110, first contact holes 111 and second contact holes 112 may be formed, each filled with a conductive material. Through the first contact holes 111 and the second contact holes 112, the thin metal film 120 is respectively in contact with the vias 160 and the metal pads 101 in the image sensor dies 100. In the third passivation layer 170, third contact holes 171 each filled with a conductive material may be formed, the backside metal layer 180 is in contact with the vias 160 through the third contact holes 171.

In this embodiment, a protective metal film 181 may be formed on the surface of the backside metal layer 180. The protective metal film 181 may be either a NiAu film or a Sn film In addition, the image sensor package according to this embodiment may include a protective glass cover which covers the second passivation layer 130 and the micro lens surfaces 100a. The protective glass cover may be made of infrared (IR) glass capable of blocking and/or filtering out infrared radiation (e.g., with a wavelength in the range of 750 nm-1 mm) In a preferred embodiment, the protective glass cover may be formed of glass with a transmissivity for infrared radiation that is close or equal to zero. The protective glass cover may be bonded to the second passivation layer 130 with an adhesive layer having a thickness of, for example, about 10 μm.

In this embodiment, as the molded layer 150 and the micro lens surfaces 100a fill the gaps between the image sensor dies 10, i.e., its first surface 150a is flush with or higher than the micro lens surfaces 100a, and since the front-side structure 300 including the first passivation layer 110, the thin metal film 120 and the second passivation layer 130 is formed on the surface of the molded layer 150a, while the protective glass cover is situated above and covers the micro lens surfaces 100a, it may not come into contact with the micro lens surfaces 100a. This can avoid an adverse impact on the micro lens surfaces 100a resulting from a load on the protective glass cover.

In this embodiment, there is also provided a lens module including the image sensor package as shown in FIG. 3e.

The lens module may include an optical lens unit consisting of, for example, one optical lens in the case of use as a cell phone camera or a group of optical lenses. The optical lens unit covers both the second passivation layer 130 and the micro lens surfaces 100a and may be glued to the second passivation layer 130 (or to the protective glass cover if present). Alternatively, the optical lens unit may be provided with a lens holder and is fixed to the image sensor package by a form fit through the lens holder.

In the lens module according to this embodiment, the molded layer 150, the third passivation layer and the backside metal layer 180 together serve as a base for the image sensor package. Additionally, as the plurality of image sensor dies 100 are disposed within the molded layer 150, the need for a PCB is dispensed with. As a result, compared to the conventional COB packaging process, the thickness of the image sensor package in the lens module can be significantly reduced. Furthermore, in the image sensor package, the metal pads 101 are laterally (i.e., in a direction parallel to the micro lens surfaces 100a) spaced apart from the micro lens surfaces 100a by a distance d' that is smaller than the distance d according to the conventional CMOB packaging process. Therefore, the package may be made slimmer and compacter and, when used for constructing a lens module, allows an optimized spatial design thereof, for example, each of miniaturization.

It is noted that the methods and structures according to the foregoing embodiments are described in a progressive manner, with the description of each method or structure not described at the first place focusing on its differences from the method(s) or structure(s) described above. As the structures correspond to the methods, they are described in a simplified manner and reference can be made to the description of the methods for its relevant details.

The preferred embodiments presented above are merely examples and are in no way meant to limit the present invention. Numerous possible modifications and variations may be made to the subject matter of the present invention by those skilled in the art based on the above teachings without departing from the scope of the present invention. Accordingly, any simple variations, equivalent changes and modifications made to the foregoing embodiments based on the substantive disclosure of the present invention without departing from the scope of the subject matter of the present invention fall within the scope of the subject matter of the present invention.

What is claimed is:

1. An image sensor package, comprising:
a plurality of image sensor dies spaced apart from one another and comprising micro lens surfaces oriented in a same direction and backsides opposing to the micro lens surfaces; and
a molded layer, which fills gaps between the plurality of image sensor dies and surrounds the plurality of image sensor dies, the molded layer comprising a first surface oriented in a same direction as the micro lens surfaces and a second surface oriented in a same direction as the backsides,
wherein a distance between the first and second surface of the molded layer is equal to or greater than a distance between the micro lens surfaces and the backsides of the plurality of image sensor dies,
the image sensor package further comprising:
metal pads formed in non-photosensitive areas on a side of the micro lens surfaces, the metal pads adapted to connect the plurality of image sensor dies to an external circuitry;
vias formed in the molded layer, the vias filled with a conductive material;
a front-side structure on the side of the micro lens surfaces, the front-side structure comprising, formed sequentially external to the micro lens surfaces, a first passivation layer, a thin metal film and a second passivation layer,
a backside structure on a side of the backsides of the plurality of image sensor dies, the backside structure comprising a third passivation layer covering both the second surface and the backsides of the plurality of image sensor dies and a backside metal layer on a surface of the third passivation layer,
wherein both the thin metal film and the backside metal layer are in contact with the vias and wherein the thin metal film is further in contact with the metal pads.

2. The image sensor package according to claim 1, further comprising: first contact holes and second contact holes formed in the first passivation layer and third contact holes formed in the third passivation layer, wherein the thin metal film forms in contact with the vias and the metal pads through the first contact holes and the second contact holes, respectively; and wherein the backside metal layer forms in contact with the vias through the third contact holes.

3. The image sensor package according to claim 1, further comprising a protective glass cover covering the second passivation layer and the micro lens surfaces.

4. The image sensor package according to claim 1, wherein the metal pads are spaced apart from the micro lens surfaces with respect to a direction parallel to the micro lens surfaces by a distance of smaller than 50 µm.

5. The image sensor package according to claim 1, wherein the molded layer comprises a thermosetting resin.

6. A lens module comprising the image sensor package according to claim 1.

* * * * *